US012690430B2

(12) United States Patent
Smith et al.

(10) Patent No.: US 12,690,430 B2
(45) Date of Patent: Jul. 21, 2026

(54) FORMATION OF LOW-TEMPERATURE AND HIGH-TEMPERATURE IN-SITU DOPED SOURCE AND DRAIN EPITAXY USING SELECTIVE HEATING FOR WRAP-AROUND CONTACT AND VERTICALLY STACKED DEVICE ARCHITECTURES

(71) Applicant: Tokyo Electron Limited, Tokyo (JP)

(72) Inventors: Jeffrey Smith, Clifton Park, NY (US); Hiroaki Niimi, Cohoes, NY (US); Daniel Chanemougame, Albany, NY (US); Lars Liebmann, Albany, NY (US); H. Jim Fulford, Marianna, NY (US); Mark I. Gardner, Cedar Creek, TX (US); Kandabara Tapily, Albany, NY (US); Anton J. Devilliers, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 202 days.

(21) Appl. No.: 17/196,137

(22) Filed: Mar. 9, 2021

(65) Prior Publication Data

US 2022/0051905 A1 Feb. 17, 2022

Related U.S. Application Data

(60) Provisional application No. 63/064,876, filed on Aug. 12, 2020.

(51) Int. Cl.
*H10P 95/90* (2026.01)
*H10P 72/00* (2026.01)

(52) U.S. Cl.
CPC .......... *H10P 95/90* (2026.01); *H10P 72/0436* (2026.01)

(58) Field of Classification Search
CPC ................. H01L 21/324; H01L 21/268; H01L 29/41791; H01L 29/0847; H01L 29/665;
(Continued)

(56) References Cited

U.S. PATENT DOCUMENTS 4,559,086 A * 12/1985 Hawkins ............. H01L 21/3221
148/DIG. 71
5,965,917 A * 10/1999 Maszara ........... H01L 29/66772
257/E21.415
(Continued)

FOREIGN PATENT DOCUMENTS

KR        1999-0036745 A      5/1999
KR        10-2010-0028243    *  3/2010  ........... H01L 29/665
WO        WO 2022/035520     *  2/2022  ....... H01L 29/66795

OTHER PUBLICATIONS

International Search Report and Written Opinion issued Oct. 28, 2021 In PCT/US2021/039941, 9 pages.
(Continued)

*Primary Examiner* — Mary A Wilczewski
(74) *Attorney, Agent, or Firm* — Oblon, McClelland, Maier & Neustadt, L.L.P.

(57) ABSTRACT

Techniques herein provide thermal processing solutions applicable to both existing FINFET applications, including wrap-around contacts, as well as 3D architectures such as transistor-on-transistor and gate-on-gate monolithic or heterogeneous CFET. Techniques include heating or annealing a first target material without heating or affecting performance of a second material or other materials. Techniques include using a first heating process to heat a substrate and materials provided thereon to a first temperature, and then using a wavelength/frequency tunable second heating process to increase temperature of the target material without increasing temperature of the second material or other materials.

14 Claims, 5 Drawing Sheets

(58) Field of Classification Search

CPC ............. H01L 29/66795; H01L 29/785; H01L 21/76897; H01L 2225/06503; H01L 25/074; H10D 30/0212; H10D 30/6219; H10D 88/01; H10P 95/90; H10P 34/42; H10W 72/0436

See application file for complete search history.

(56) References Cited

U.S. PATENT DOCUMENTS

| | | | | |
|---|---|---|---|---|
| 6,015,752 A * | 1/2000 | Xiang | ............... | H01L 29/41783 |
| | | | | 438/678 |
| 6,165,903 A * | 12/2000 | Besser | ............. | H01L 21/28518 |
| | | | | 438/303 |
| 6,380,044 B1 * | 4/2002 | Talwar | .................. | H01L 21/268 |
| | | | | 257/E21.336 |
| 6,869,867 B2 * | 3/2005 | Miyashita | ............ | H10D 84/038 |
| | | | | 438/453 |
| 7,692,254 B2 * | 4/2010 | Anderson | ......... | H01L 29/66795 |
| | | | | 257/E29.022 |
| 8,021,950 B1 * | 9/2011 | Abadeer | ............... | H01L 21/268 |
| | | | | 257/E21.409 |
| 8,518,765 B1 * | 8/2013 | Duong | ................... | C11D 7/265 |
| | | | | 438/682 |
| 9,099,412 B2 * | 8/2015 | Leobandung | ......... | H01L 21/845 |
| 9,543,167 B2 * | 1/2017 | Anderson | ......... | H01L 29/66795 |
| 10,164,048 B1 | 12/2018 | More et al. | | |
| 10,283,365 B1 * | 5/2019 | Smith | ................. | H01L 29/1033 |
| 10,347,762 B1 * | 7/2019 | Liu | ................... | H01L 29/66545 |
| 10,453,925 B2 | 10/2019 | Ueno. et al. | | |
| 10,573,752 B2 | 2/2020 | Li | | |
| 10,586,872 B2 | 3/2020 | Carr et al. | | |
| 10,651,287 B2 | 5/2020 | More et al. | | |
| 10,658,468 B2 | 5/2020 | Ueno et al. | | |
| 10,886,376 B2 | 1/2021 | Carr et al. | | |
| 10,898,965 B2 | 1/2021 | Carr et al. | | |
| 10,964,818 B2 | 3/2021 | Li | | |
| 11,133,222 B2 * | 9/2021 | Tsai | .................. | H01L 21/02675 |
| 2003/0162389 A1 * | 8/2003 | Wieczorek | ........ | H01L 21/28518 |
| | | | | 257/E21.199 |
| 2004/0058500 A1 * | 3/2004 | Lee | ................... | H01L 21/28518 |
| | | | | 257/E21.228 |
| 2006/0211225 A1 * | 9/2006 | Kageyama | .......... | H01L 29/6678 |
| | | | | 438/502 |
| 2006/0281305 A1 * | 12/2006 | Jung | ..................... | H01L 29/665 |
| | | | | 438/655 |
| 2007/0054481 A1 * | 3/2007 | Chen | ..................... | H01L 21/324 |
| | | | | 438/581 |
| 2008/0214021 A1 * | 9/2008 | Tanaka | .............. | H01L 21/02529 |
| | | | | 438/798 |
| 2008/0293205 A1 * | 11/2008 | Kwon | ................. | H01L 29/0692 |
| | | | | 438/293 |
| 2009/0227099 A1 * | 9/2009 | Zollner | ............. | H01L 21/28518 |
| | | | | 438/622 |
| 2010/0099268 A1 * | 4/2010 | Timans | ............. | H01L 21/67115 |
| | | | | 438/758 |
| 2010/0276761 A1 * | 11/2010 | Tung | ................... | H01L 29/7856 |
| | | | | 438/283 |
| 2011/0298058 A1 * | 12/2011 | Kawasaki | ........ | H01L 29/66795 |
| | | | | 257/E27.059 |
| 2013/0122670 A1 * | 5/2013 | Duong | ................... | H01L 21/28 |
| | | | | 257/E21.409 |
| 2014/0057399 A1 * | 2/2014 | Newbury | ............... | H01L 29/45 |
| | | | | 257/E21.409 |
| 2014/0167264 A1 * | 6/2014 | Besser | ............... | H01L 29/4916 |
| | | | | 438/664 |
| 2015/0041918 A1 * | 2/2015 | Wann | .................. | H01L 27/0886 |
| | | | | 438/283 |
| 2015/0191847 A1 * | 7/2015 | Benaissa | ........... | H01L 21/02678 |
| | | | | 428/641 |
| 2015/0279840 A1 * | 10/2015 | Huang | ............. | H01L 29/66545 |
| | | | | 438/283 |
| 2016/0020208 A1 * | 1/2016 | Anderson | ............... | H01L 29/16 |
| | | | | 438/283 |
| 2017/0221709 A1 | 8/2017 | Ueno et al. | | |
| 2017/0358592 A1 * | 12/2017 | Yamaguchi | ......... | H01L 29/0847 |
| 2019/0006509 A1 | 1/2019 | Li | | |
| 2019/0109194 A1 | 4/2019 | Ueno et al. | | |
| 2019/0165124 A1 | 5/2019 | More | | |
| 2019/0362971 A1 * | 11/2019 | Wong | .................... | C01B 19/007 |
| 2020/0006159 A1 | 1/2020 | Shih et al. | | |
| 2020/0006545 A1 * | 1/2020 | Liu | ................... | H01L 29/66795 |
| 2020/0013900 A1 | 1/2020 | Carr et al. | | |
| 2020/0098927 A1 | 3/2020 | Carr et al. | | |
| 2020/0098928 A1 | 3/2020 | Carr et al. | | |
| 2020/0105920 A1 | 4/2020 | Li | | |
| 2020/0273963 A1 | 8/2020 | More et al. | | |
| 2020/0279920 A1 | 9/2020 | Ueno et al. | | |
| 2022/0051905 A1 * | 2/2022 | Smith | ................... | H01L 29/665 |

OTHER PUBLICATIONS

Korean Office Action dated Apr. 21, 2025 in Korean Patent Application No. 10-2023-7006843 w/English translation, 14 pages.
Office Action dated Nov. 12, 2024 issued in Taiwanese Patent Application No. 110129240 (with English translation).
Korean Office Action issued on Dec. 23, 2025 in Korean Patent Application No. 10-2023-7006843 (with English translation), 14 pages.

* cited by examiner 105
110
115
120
125

150
145
140
135
130

BACKGROUND

205
210
215
220
225

250
245
240
235
230

BACKGROUND

400

Provide substrate and materials
405

Heat substrate and materials using
first heating process
410

Heat first material using second
heating process
415

Determine dopant concentration in
first material
420

Adjusting peak wavelength and
intensity of second heating process
based on dopant concentration
425

Execute deposition process
430

FORMATION OF LOW-TEMPERATURE AND HIGH-TEMPERATURE IN-SITU DOPED SOURCE AND DRAIN EPITAXY USING SELECTIVE HEATING FOR WRAP-AROUND CONTACT AND VERTICALLY STACKED DEVICE ARCHITECTURES

CROSS REFERENCE TO RELATED APPLICATIONS

This present disclosure claims the benefit of U.S. Provisional Application No. 63/064,876, filed on Aug. 12, 2020, which is incorporated herein by reference in its entirety.

FIELD OF THE INVENTION

The present disclosure relates to a method of fabrication for a semiconductor device. In particular, device processing is performed wherein high temperature processes are completed prior to the deposition of predetermined metals.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the manufacture of a semiconductor CMOS device, high temperature processes, such as epitaxy growths and activation anneals, are performed prior to the deposition of metals, such as work function metals in HKMG (high-k metal gate), silicides used to make contact between source/drain and interconnect, and porous ultra-low k films used as dielectrics in back end of line metal layers.

SUMMARY

The present disclosure relates to a method of fabricating a semiconductor device, including: providing a substrate including a first material and a second material disposed on a surface of the substrate; heating the substrate, the first material, and the second material to a first temperature using a first heating process, the first temperature being less than a predetermined threshold temperature; and heating the first material to a second temperature using a second heating process, the second heating process heating the first material more than the second material, the second temperature being less than the predetermined threshold temperature The present disclosure additionally relates to a system for fabricating a semiconductor device, including: a processing chamber configured to receive a wafer; a first heating device configured to heat the processing chamber and the wafer, the wafer including a first material and second material; and a second heating device configured to direct energy at the wafer at one or more predetermined wavelengths having a predetermined intensity to heat the first material on the wafer.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Figure 1:
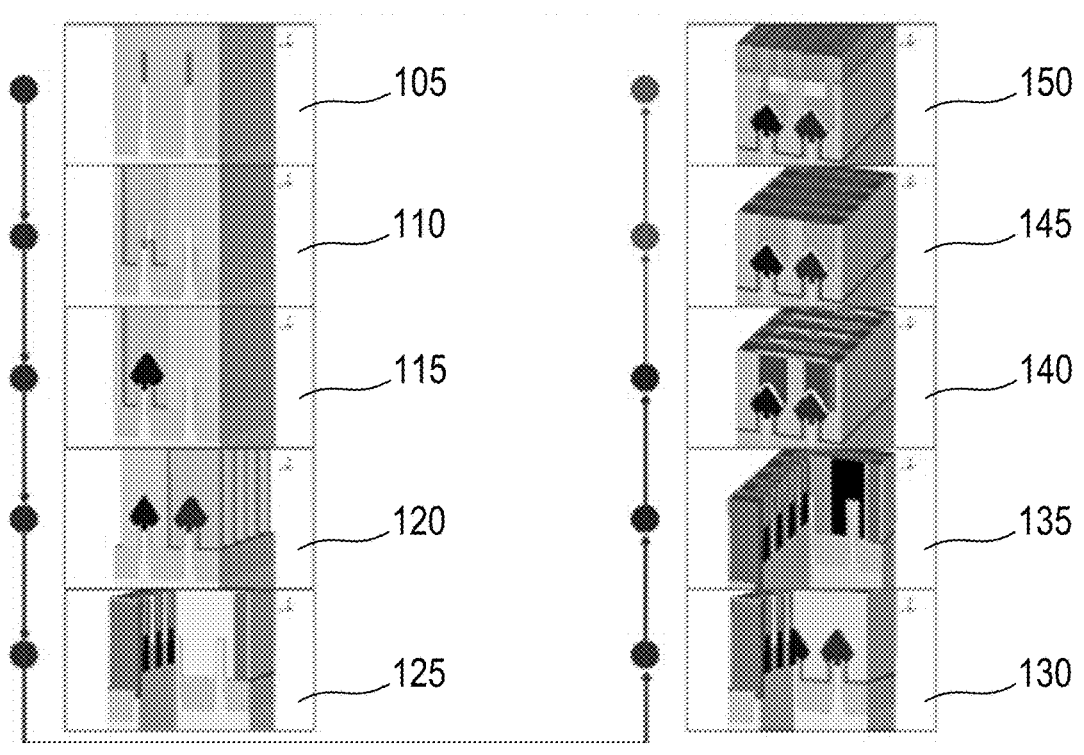
FIG. 1 is an example of thermal processing steps for fin field-effect transistor logic devices.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

FIG. 1 shows an example of thermal processing steps for fin field-effect transistor (FINFET) logic devices. A number of the high temperature processes, such as shallow trench isolation (STI) anneal, silicon pre-cleaning and epitaxy growth, and high-k reliability anneals, are completed prior to the deposition of work function metals within the HKMG structure and the formation of silicides in the contact/interconnect module. A structure at step 105 shows an STI anneal, for example, at 1000° C. The structure at step 110 shows a Si pre-clean at, for example, 750° C. to 800° C. The structure at step 115 shows formation of a source/drain for an NMOS device at, for example, 600° C. to 700° C. The structure at step 120 shows formation of a source/drain for a PMOS device at, for example, 525° C. to 650° C. The structure at step 125 shows a reliability anneal at, for example, 700° C. to 780° C. The structure at step 130 shows activation of the source/drains for the NMOS and PMOS devices at, for example, 800° C. to 1,100° C. The structure at step 135 shows depositions of work function metals. The structure at step 140 shows silicide formation. The structure at step 145 shows interconnect post-metallization anneal at, for example, 450° C. The structure at step 150 shows metallization.

This temperature-based integration flow, however, is challenging to implement with 3D devices, that is, architectures with vertical stacks of field-effect transistors. Two important changes to CMOS device manufacturing are changing the thermal management processing flow. One change includes a need to use of wrap-around contacts (WAC) in which silicide is formed over as much of the source and drain contact surface area as possible, as well as the interconnect metal. The purpose is drive down contact resistance as a mechanism to boost the overall power/performance/area (PPA) metric of the device. A second change includes the introduction of 3D logic architectures such as transistor-on-transistor stacking or gate-on-gate stacking. The 3D stacking can be executed, for example, using complimentary field effect transistor (CFET) types of devices. Formation of stacked devices can be realized either with monolithic stacking (single wafer) or heterogeneous stacking (wafer on wafer).

Figure 2:
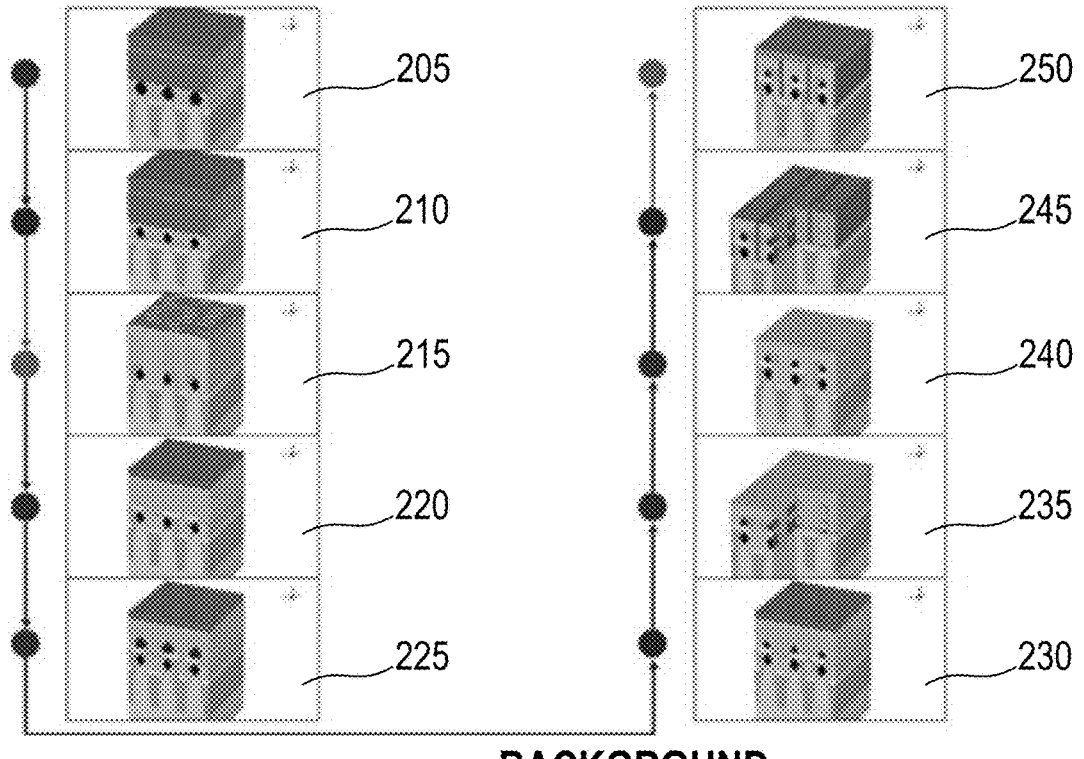
FIG. 2 is an example of a CFET type of process flow for device-on-device stacking.

FIG. 2 shows an example of a CFET type of process flow for device-on-device stacking. Notably, a bottom device interconnect will be fully formed, wherein a temperature sensitive silicide is formed in a lower tier interconnect structure before additional high-temperature processes are performed for the subsequent devices that will be formed above a corresponding device. A fully-formed bottom interconnect can introduce processing challenges, such as maintaining a level of thermal control for the subsequent processing to prevent damage to the sensitive metals or silicide formed in the completed bottom-tier devices. A structure at step 205 shows formation of a source/drain for a NMOS device at, for example, 600° C. to 700° C. The structure at step 210 shows NMOS silicide formation. The structure at step 215 shows a post-metallization anneal at, for example, 450° C. to 650° C. The structure at step 220 shows a Si pre-clean at, for example, 750° C. to 800° C. The structure at step 225 shows formation of a source/drain for a PMOS device at, for example, 550° C. to 650° C. The structure at step 230 shows PMOS silicide formation. The structure at step 235 shows a reliability anneal at, for example, 700° C. to 780° C. The structure at step 240 shows activation of the source/drains for the NOMS and PMOS devices at, for example, 800° C. to 1,100° C. The structure at step 245 shows work function metal deposition. The structure at step 250 shows a post-metallization anneal at, for example, 450° C.

For the case of monolithically formed CFET devices outlined above, the formation and silicidation of the contacts and subsequent metallization of the lower tier and upper tier devices is performed prior to the high-k metal gate (HKMG) process so the silicide on the lower tier devices will experience the thermal processing associated with forming the upper device structure as well as the reliability anneals within the HKMG process. For heterogeneous CFET devices, the process is similar with the exception that the bottom device will likewise have a bottom transistor formed prior to the formation of the upper device and transistor. Both integrations of a CFET device will have the same fundamental thermal limitations.

This challenge is exacerbated by having multiple CFET structures stacked on top of one another to form multiple planes of logic devices for future CMOS scaling. As with the case of CFET devices, the WAC will often require that the formation of the silicide around the source and drain contact be formed prior to any high temperature processing done within the HKMG process. Unlike CFET devices, however, the interconnect for a FINFET based device using wrap-around contact will not have any interconnect metallization done. Nevertheless, the silicide is a thermally sensitive material which can undergo phase change or agglomeration associated with the higher temperature processes and thus still poses a challenge.

Accordingly, techniques herein provide thermal processing solutions applicable to both existing FINFET applications (including WACs) as well as 3D architectures such as transistor-on-transistor and gate-on-gate monolithic or heterogeneous CFET. Techniques include heating or annealing a first (target) material without heating or affecting performance of a second material(s). Techniques include using a first heating mechanism to heat a substrate to a first temperature, and then using a wavelength/frequency tunable second heating mechanism to increase temperature of the target material without increasing temperature of the second material.

Figures 3A, 3B, 3C:
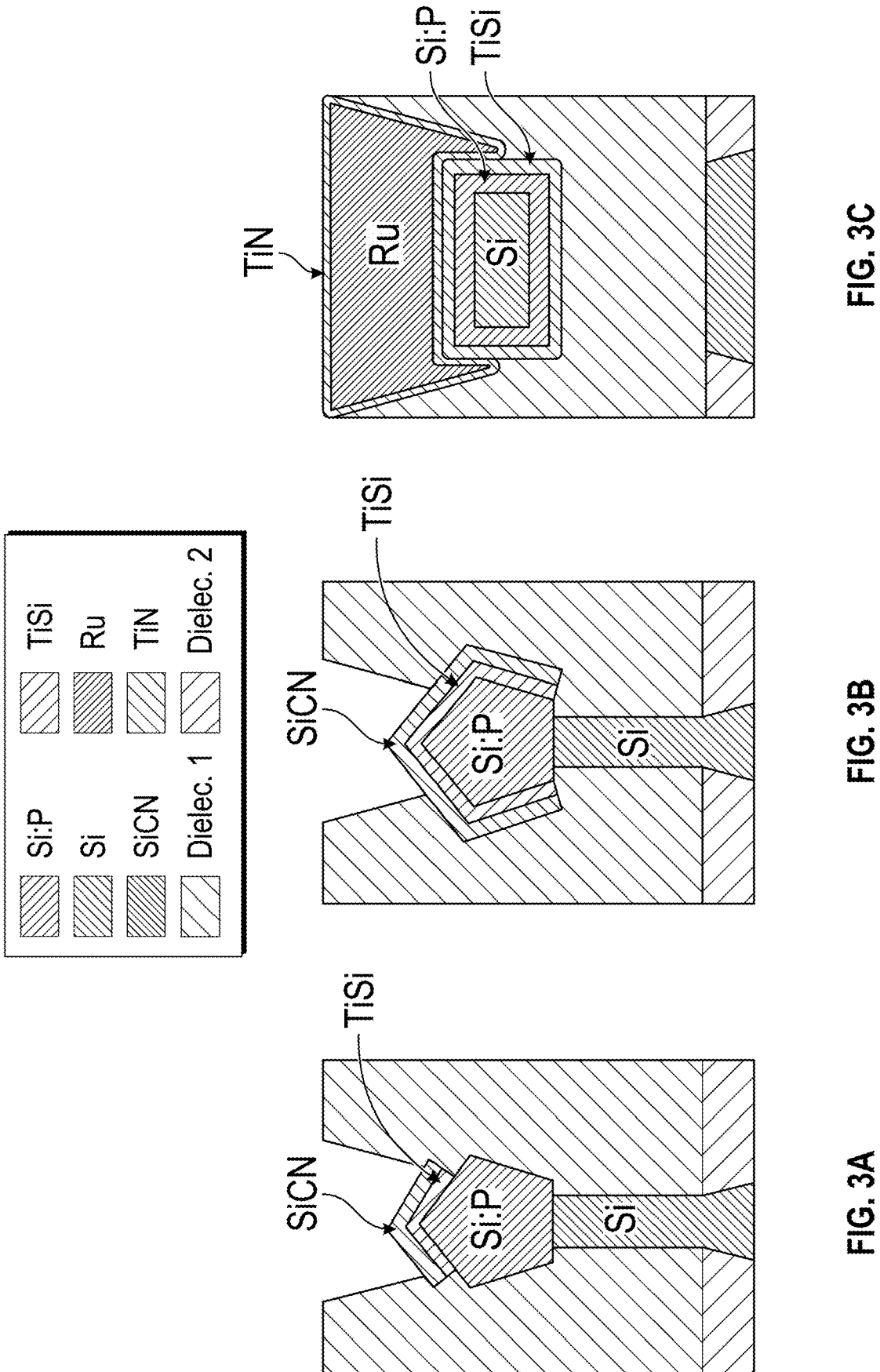
FIGS. 3A-3C are cross-sectional schematics of various source and drain contact structures, according to an embodiment of the present disclosure.

FIGS. 3A-C are cross-sectional schematics of various source and drain contact structures, according to an embodiment of the present disclosure. FIG. 3A is a cross-sectional schematic of an n-type source and drain contact structure prior to metallization. FIG. 3B is a cross-sectional schematic of a wrap-around contact prior to metallization. FIG. 3C is a cross-sectional schematic of a CFET contact in which the local interconnect is metalized prior to subsequent complimentary device formation. For processing used in FIG. 3A, the silicide can be formed after the local interconnect trench is used to open the source and drain epitaxy contact. Typically a protective liner, for example a SiN or SiCN liner, can be used to prevent oxygen diffusion into the contact or damage from interconnect trench opening etch processes. This protective liner is easily removed with little to no damage to the surface of the source and drain contact. For processing used in FIG. 3B, the silicide should cover as much of the surface of the source and drain contact as possible. Given that the interconnect trench cannot easily overlap the entire contact structure without causing an area penalty to the standard cell given limitations on the size of the interconnect trench width, the silicide is formed after the epitaxy growth of the source and drain contacts. Thus the silicide is in place prior to the opening of the contact through the interconnect trench which is typically done after the HKMG process in which high temperature processes (such as reliability anneals) are typically done. In FIG. 3C, the CFET contact follows a similar processing as the WAC with the exception that the interconnect metal electrode is formed and metalized ahead of the HKMG processing. As such, not only is the silicide vulnerable to the temperature effects of the reliability anneal process, the selection of the interconnect metal as well as any control of diffusion of dopant species from the contact to the high conductance interconnect metal is also vulnerable.

Thus, in an embodiment, a maximum thermal processing temperature of 500° C. can be set once a silicide has been grown on the source and drain contact. For example, for the CFET device in which the bottom device is formed, the maximum thermal processing temperature can dictate that the upper source and drain epitaxy formation be completed at 500° C. For current device geometries and stacked FET devices, the source and drain epitaxy can be grown with in-situ doping in which the solubility of the dopant species into the source and drain epitaxy is thermally dependent. For example, for the case of phosphorous in-situ doping to epitaxy silicon as would be used for the NMOS device, the nominal doping level achieved with nominal processing temperatures of 700° C. can exceed 1E21 atoms/cm$^3$. When this temperature is decreased to 500° C., the maximum doping which can be achieved can be 7E20 atoms/cm$^3$. The reduced doping levels within the source and drain epitaxy result is significant reduction in contact resistance which will have a direct detrimental impact to the PPA metric of the chip.

The ability to selectively heat one material or set of materials selective to other materials herein provides some mechanism to resolve issues highlighted above. Techniques herein can use microwave annealing to selectively target particular materials in a device stack. Microwave annealing systems employ tunable microwave energy within a given spectrum range. Such tunable systems can be used to isolate materials for selective heating. It may be appreciated that there are various microwave annealing systems that are conventionally available to selectively heat the isolated materials.

For the example of a CFET device in which the bottom source and drain has been grown, the silicide formed, and the bottom interconnect metalized, the upper in-situ epitaxy growth can be executed at a processing chamber temperature of 500° C. in conjunction with a microwave anneal that is primarily targeting the material used in the upper device. By way of a specific, non-limiting example, if the bottom device is NMOS where the source and drain is comprised of epitaxial silicon with phosphorous in-situ doping with a titanium silicide and the interconnect structure is metalized with a high conductance metal such as cobalt or ruthenium, then the upper PMOS device would be comprised of silicon germanium (typically with the germanium component being within the range of 25 to 50 atomic percent) doped with boron in order to provide lattice-mismatched induced strain on the PMOS silicon channel to drive mobility across the channel.

With the microwave frequency tuned to be selective to silicon germanium with lower absorption by silicon, the upper source and drain epitaxy can be heated to a temperature higher than 500° C. to allow for the increased dopant solubility into the contact. Meanwhile, the silicon-phosphorous contact on the lower device will only encounter the chamber temperature plus any energy from the reduced microwave absorption and from any thermal diffusion from the upper device structure. This method can be used to preserve the thermal limitations of the lower device while allowing the upper device to be processed using a temperature which can increase the dopant solubility to a level at which a desired contact resistance can be achieved for the upper device. A range for the microwave frequency of the tunable microwave anneal system is 2 GHz to 7 GHz, or 5.5 GHz to 6.5 GHz.

Silicon and silicon germanium will absorb microwave energy at discreet frequencies. Once doping species are added to these epitaxy materials, however, the absorption frequency or wavelength can change. Accordingly, a level of selectivity should be identified to adjust an anneal process such as by increasing or decreasing a particular wavelength to match absorbance with uptake of doping species. For example, in the case mentioned above, upper device in-situ doped epitaxy growth process can initially be set at 500° C. chamber temperature to allow moderate doping saturation levels. Then a microwave anneal can be activated that is targeted to the partially doped silicon germanium to selectively heat the upper source and drain to higher temperatures, thereby increasing dopant saturation. Accordingly, systems and methods herein include changing a wavelength of the microwave anneal during the physical annealing process.

In some embodiments, placement of the actual microwave anneal can be configured as remote processing within the chemical vapor deposition (CVD) epitaxy chamber itself. Alternatively, a sequential chamber process can be used in which targeted material is annealed to a high temperature and then transferred to an epitaxy CVD chamber for processing.

In some embodiments, laser heating can be included. Selective heating can be additionally (or in place of) provided by using specific laser frequencies in which different wavelengths more readily absorb into materials (such as silicon) and provide adequate absorption selectivity to other species such as phosphorous doped silicon, silicon germanium, or germanium. Thus, alternative techniques can use energy supplied by a tuned laser to perform functions outlined as described herein. A range for the predetermined wavelength of the tunable laser anneal system can be 700 nm to 2,000 nm, or 800 nm to 1,500 nm, or 900 nm to 1,300 nm. It may be appreciated that there are various laser annealing systems that are conventionally available.

In one embodiment, a channel is formed as part of a CMOS device. The channel can be formed of various materials such as silicon, silicon germanium, germanium, and doped silicon. A dielectric material, such as a low-k spacer or gate spacer, forms an opening at an end of one or both lateral ends of the channel of the CMOS device. The spacer can be subsequently removed to form what is commonly known as an air-gap gate spacer. Alternatively, the spacer can remain as a physical dielectric barrier between the metal gate and metal contact electrodes. Initial source and drain epitaxial growth can be initiated from the ends of the channel at a temperature within the specification limits established by present thermally sensitive materials within the corresponding integration flow. For example, the initial source and drain epitaxial growth can be limited to a temperature threshold of a fabricated device element or material on the wafer. Initial epitaxial growth can be either un-doped or doped. A dopant concentration can be limited by the maximum allowable thermal specifications (i.e. the temperature threshold) established by the integration process.

A deposition temperature of an initial deposition can range from a minimum required temperature for un-doped source/drain epitaxial growth, for example as low as 400°

C., up to a maximum temperature allowed by the integration. For example, for the case of a CFET device in which TiSi has been used as the silicide for the lower tier device, the maximum thermal temperature can be 500° C. to 700° C. The range can depend on the phase change of the silicide being incorporated into the device and the duration of the annealing process.

After a portion of the source/drain structure is formed/ grown using the lower chamber temperature, the selective heating mechanism can be activated that increases dopant saturation into the continually growing epitaxial film by heating epitaxial material that is selective to wafer materials having a lower thermal threshold. For example, a first heating mechanism can heat the entire wafer. The first heating mechanism can be the chamber bake, for example. Then a second heating mechanism can be used to heat the source/drain material without heating thermally-sensitive material above a predetermined threshold. The second heating mechanism can be, for example, the tunable microwave generator with sufficient material selectivity. The microwave anneal system selected can be configured to tune microwave energy to be readily absorbed by one species or material, such as silicon, but not absorbed sufficiently by a second material (such as silicon germanium), and vice-versa. This can be accomplished by adjusting the emitted microwave wavelength of the microwave anneal system. The wavelength can have a narrow full-width half max at its peak to increase selectivity to other materials and thus avoid over-lapping other absorbance cross-sections.

Alternatively, the second heating mechanism can be the laser-based system in which light at different wavelengths can be used to be absorbed by specific materials selective to one another. Wavelength tunable laser systems, for example, can be used. In some embodiments, three heating mechanisms can be used such as the bake chamber, the tunable microwave anneal system, and the tunable laser anneal system.

By way of specific, example, embodiments, epitaxial silicon germanium (either in-situ doped with boron or un-doped) can be grown from a silicon channel at an initial chamber temperature of 400° C. to 500° C. to form a PMOS source and drain contact with a very low doping profile. After initial growth of the silicon germanium (either in-situ doped with boron or un-doped), a secondary heating, such as the selective anneal (e.g. the tunable microwave and/or laser anneal), can be performed which increases the temperature of the silicon germanium or the silicon germanium with in-situ doped boron, without significant heating to any existing source/drain or channel materials, such as silicon or silicon with in-situ doped phosphorous or arsenic or other doping species. Likewise, the secondary heating can heat the target material without heating/damaging the existing formed silicide on other formed devices (such as devices in a monolithic or heterogeneous CFET integration).

The increased temperature of the silicon germanium or in-situ doped silicon germanium enables a higher in-situ doping level of species, such as boron, into the film, thus increasing the overall conductance of the source and drain contact. The increased doping results in lower contact resistance compared to the situation where the in-situ dopant is limited to the saturation corresponding to the lower temperature. Such temperatures where a modest dopant saturation can occur can be around 600° C. to 750° C., which can be outside the thermal stability limit of most silicides on other existing devices that may be present in CFET type of architectures. Accordingly, targeted, material-specific, high-temperature anneal can be executed without heating sur-rounding materials above a level that degrades device performance.

As can be appreciated, various materials can be targeted without excessive heating in various other materials. For example, selective annealing can be executed with the intended/target growth material being epitaxial silicon with in-situ doped phosphorous or other n-type doping species. Meanwhile, during selective annealing, materials such as any formed silicon germanium or in-situ doped silicon germanium source and drain contacts already present at the time of the processing, are not affected or significantly affected.

The mechanism for the selective heating process will also have in-process tunable capabilities to reflect the changing nature of the film being deposited. For example, the initial growth of a target material (for example, un-doped silicon germanium from silicon channel) can be realized with a nominal CVD chamber temperature with or without any outside heating from either a microwave system or laser system. When secondary heating is executed during the epitaxial deposition process, the frequency or wavelength used is set so that greater absorption occurs with the silicon germanium on in-situ doped silicon germanium and the absorption into silicon will be less.

As dopant species are added to the silicon germanium growth, the microwave and laser absorption peaks can shift. In other words, for a predetermined wavelength, as the material composition changes, an absorption spectrum or cross-section of that material can change. Accordingly, the microwave anneal and/or laser anneal can have a corre-sponding shift in frequency or wavelength during the pro-cess to maximize absorbance for the targeted film as it is being doped (and changing in concentration). In some embodiments, a set of microwave frequencies can be tar-geted for the maximum selectivity difference in absorption between silicon germanium and silicon. During this process where in-situ dopants such as boron are introduced, the microwave frequency can be tuned during the process to be able to provide maximum selectivity difference between the in-situ doped silicon germanium and silicon or in-situ doped silicon.

In one embodiment, the secondary heating mechanism can be controlled to be able to turn on or off, or have the intensity of the annealing be modulated to control the overall heat transfer from the intended targeted material to materials in which some level of thermal separation or selectivity is to be desired. For example, any selective heating on an in-situ doped silicide that is transferred to a lower-tier contact structure in which the heat could be absorbed by the formed silicide structure can cause crystal reorientation which can negatively impact the device.

In one embodiment, a predictive or in-situ measured controller can be configured to determine an appropriate sequence of frequency or wavelength modulation, temporal timing of the process, etc. Such a heating sequence (changes in wavelength, energy intensity over time) optimizes the targeted absorption of energy into specific species and maintains good thermal control of the process among the entire device. Some heating sequences can include periods of no secondary heating to allow sensitive material to cool to safer temperatures.

In one embodiment, the selective heating process can be executed in particular flows in which multiple doping spe-cies are included in the process to provide more variability in the possible selectivities within the process. For example, two dopant species can be introduced into the contact formation where a dopant species A can be introduced earlier in the process to provide some functional tuning of the thermal absorption between the intended source and drain contact and an already formed complimentary source and drain contact. Subsequently, as selectivity begins to decrease with the addition of dopant A into the film, the process can be switched over to another dopant species, with a corresponding switch in second energy pattern.

In one embodiment, a system herein includes a microwave anneal system and/or laser anneal system physically embedded/integrated as part of a CVD epitaxy chamber. Alternatively, the microwave or laser anneal functionality is positioned within a separate chamber and the wafer is passed in vacuum between the CVD epitaxy deposition chamber and the anneal chamber so that the process is separated into a sequence of deposition/selective heating/deposition/selective heating. The annealing chamber can be positioned within the same physical piece of hardware but not necessarily in the same processing chamber. For embodiments including a sequential deposition process in a first chamber, a selective anneal in a second chamber, and the process repeated multiple times for a given wafer, the transfer of the wafer between the two chambers is preferably done in vacuum without any air-breaks.

In embodiments processing a monolithic or heterogeneous CFET device in which complementary devices are stacked on top of one another, a dielectric film can encapsulate the bottom tier device which has already been formed. In the growth of the upper device in-situ doped epitaxy source and drain contact, the dielectric can be tuned to have thermal selectivity to the upper source and drain epitaxy growth such that the dielectric blocks the absorption of any energy from the microwave or laser anneal. Accordingly, the inter tier dielectric film functions as a high temperature shield for wavelength targeted annealing.

In other embodiments, the frequency and/or wavelength of the anneal can be tuned to have selectivity to any dielectric film encapsulating any formed bottom tier devices in a CFET device structure, thus providing some level of protection of the bottom formed devices during the processing and annealing of the upper tier devices.

The selective heating capability herein can be extended to enabling selectivity between high-k dielectric films such as hafnium oxide and hafnium oxide with dipole dopant species such as AlO and LaO. With selectivity to the source and drain contact materials such as silicon, silicon with doped phosphorous or other n-type dopant species, silicon germanium, silicon germanium with doped boron or other p-type dopant species, germanium, and germanium with doped boron or other p-type dopant species, and formed silicide materials such as TiSi, RuSi, NiSi, NiPtSi, and others, such that the high-k film can be selectively annealed to adequate temperatures to drive reliability improvement associated with the removal of charge traps while preventing the reliability anneal process from heating the formed silicides to a temperature at which they can crystal re-orientate. As can be appreciated, techniques herein can be applied to numerous structures and material schemes in which one material can be selectively heated without overheating other materials.

Figure 4:
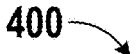
FIG. 4 is a flow chart for a method of fabricating a semiconductor device, according to an embodiment of the present disclosure.
Figure 4:
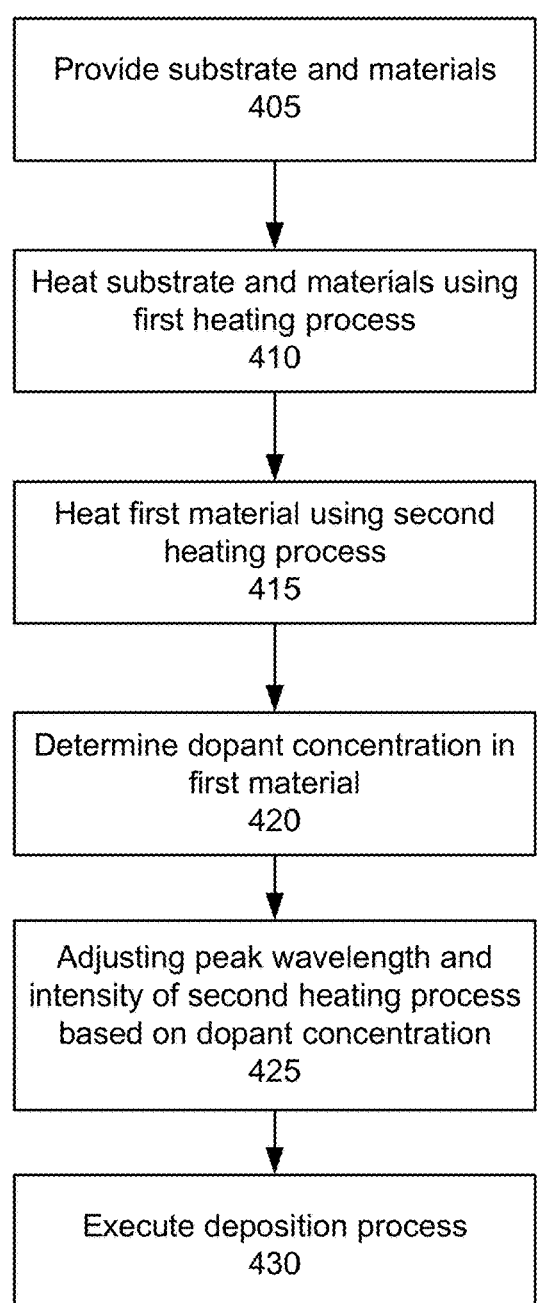

FIG. 4 is a flow chart for a method 400 of fabricating a semiconductor device using selective heating, according to an embodiment of the present disclosure. In step 405, a substrate is provided including a first material and a second material disposed on a surface of the substrate. In step 410, the substrate, the first material, and the second material are heated using a first heating process, such as a chamber bake.

In step 415, the first material is heated using the second heating process. This can be executed such that the second material is heated less, or at a slower rate, than the first material. Notably, this can allow processing of the first material while preventing unwanted effects on the second material that would occur above the predetermined temperature threshold. In step 420, a dopant concentration in the first material can be determined. Notably, the dopant concentration can be monitored during the entire heating process and the peak wavelength of the second heating process can be adjusted based on the dopant concentration in step 425. In step 430, additional depositions can be performed and the heating process can be executed again to selectively heat deposited materials.

Figure 5:
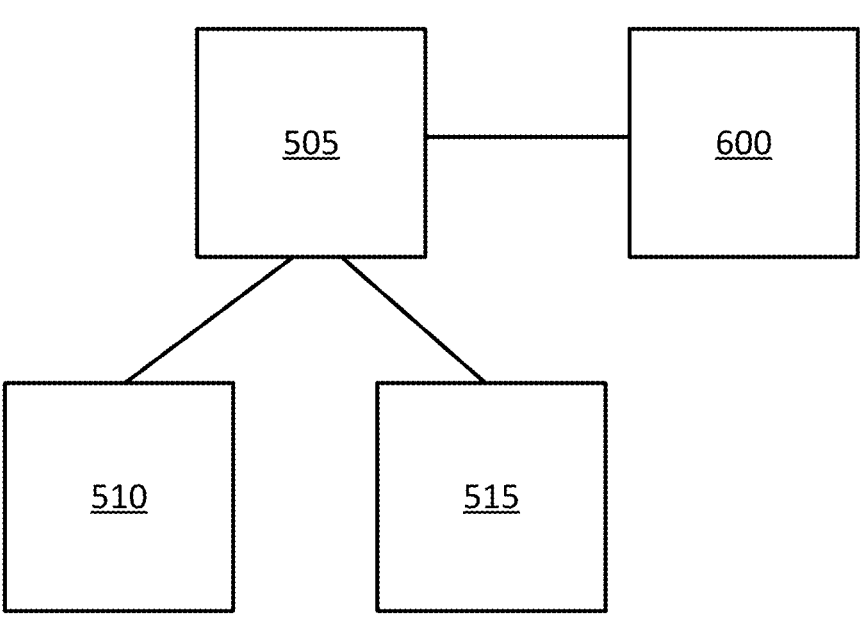
FIG. 5 is a schematic block diagram of a system for fabricating a semiconductor device using selective heating, according to an embodiment of the present disclosure.

FIG. 5 is a schematic block diagram of a system for fabricating a semiconductor device using selective heating, according to an embodiment of the present disclosure. In an embodiment, the system can be configured to execute the method 400. The system can include a processing chamber 505, a first heating device 510 configured to heat the processing chamber 505 and a wafer, the wafer including a first material and second material; and a second heating device 515 configured to direct energy at the wafer at one or more predetermined wavelengths having a predetermined intensity to heat the first material on the wafer. The system can also include a control device 600 including processing circuitry configured to execute the method 400. As previously described, it may be appreciated that there are various microwave and laser annealing systems that are conventionally available to selectively heat the isolated materials.

Figure 6:
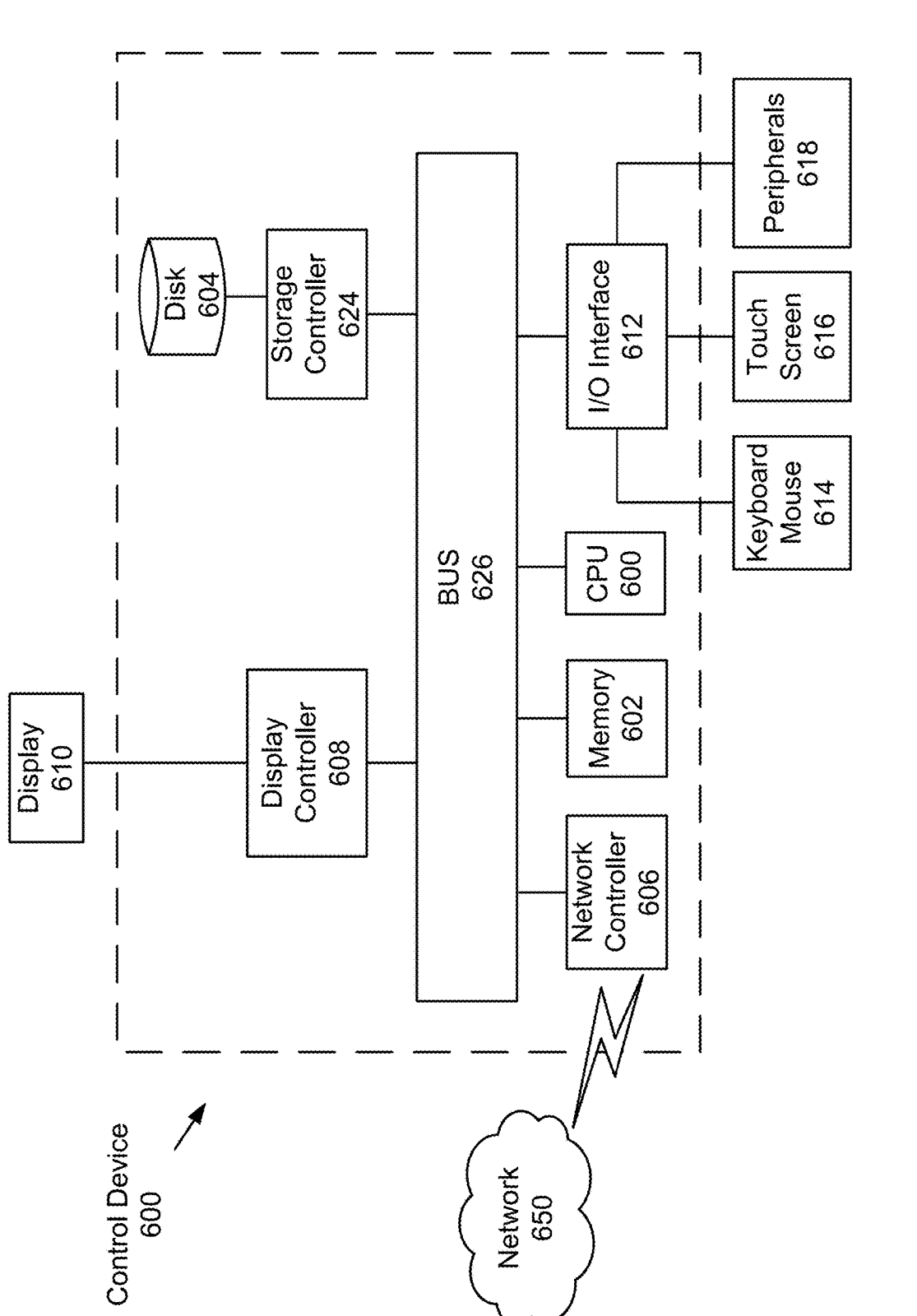
FIG. 6 is a schematic diagram of a computer for controlling the components of the system, according to an embodiment.

Next, a hardware description of the control device according to exemplary embodiments is described with reference to FIG. 6. In FIG. 6, the control device includes a CPU 600 which performs the processes described above. The process data and instructions may be stored in memory 602. These processes and instructions may also be stored on a storage medium disk 604 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the control device communicates, such as a server or computer.

Further, the claimed advancements may be provided as a utility application, background daemon, or component of an operating system, or combination thereof, executing in conjunction with CPU 600 and an operating system such as Microsoft Windows 7, UNIX, Solaris, LINUX, Apple MAC-OS and other systems known to those skilled in the art.

The hardware elements in order to achieve the control device may be realized by various circuitry elements, known to those skilled in the art. For example, CPU 600 may be a Xenon or Core processor from Intel of America or an Opteron processor from AMD of America, or may be other processor types that would be recognized by one of ordinary skill in the art. Alternatively, the CPU 600 may be implemented on an FPGA, ASIC, PLD or using discrete logic circuits, as one of ordinary skill in the art would recognize. Further, CPU 600 may be implemented as multiple processors cooperatively working in parallel to perform the instructions of the inventive processes described above.

The control device in FIG. 6 also includes a network controller 606, such as an Intel Ethernet PRO network interface card from Intel Corporation of America, for interfacing with network 650. As can be appreciated, the network 650 can be a public network, such as the Internet, or a private network such as an LAN or WAN network, or any combination thereof and can also include PSTN or ISDN sub-networks. The network 650 can also be wired, such as an Ethernet network, or can be wireless such as a cellular network including EDGE, 3G and 4G wireless cellular systems. The wireless network can also be WiFi, Bluetooth, or any other wireless form of communication that is known.

The control device further includes a display controller 608, such as a NVIDIA GeForce GTX or Quadro graphics adaptor from NVIDIA Corporation of America for interfacing with display 610, such as a Hewlett Packard HPL2445w LCD monitor. A general purpose I/O interface 612 interfaces with a keyboard and/or mouse 614 as well as a touch screen panel 616 on or separate from display 610. General purpose I/O interface 612 also connects to a variety of peripherals 618 including any peripherals appropriate for electron microscopy.

The general purpose storage controller 624 connects the storage medium disk 604 with communication bus 626, which may be an ISA, EISA, VESA, PCI, or similar, for interconnecting all of the components of the control device. A description of the general features and functionality of the display 610, keyboard and/or mouse 614, as well as the display controller 608, storage controller 624, network controller 606, sound controller 620, and general purpose I/O interface 612 is omitted herein for brevity as these features are known.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of fabricating a semiconductor device, comprising:

providing a substrate including a lower-tier first transistor device including a first source/drain material;

performing a first heating process on the substrate and the first transistor device to form a layer of first silicide material from the first source/drain material;

providing a second transistor device as an upper-tier transistor device vertically stacked above the lower-tier first transistor device on the substrate in a complementary field effect transistor (CFET) architecture including a second source/drain material, the first silicide material having a first silicide material absorption wavelength and the second source/drain material having a second source/drain material absorption wavelength, the first silicide material absorption wavelength being different from the second source/drain material absorption wavelength; and performing a selective heating process on the substrate, the first transistor device with the first silicide material and the second transistor device using a selective wavelength based on the first silicide material absorption wavelength being different from the second source/drain material absorption wavelength, the selective heating process heating the second source/drain material without substantially heating the first silicide material by causing the second source/drain material to reach a first temperature based on the second source/drain material absorption wavelength substantially absorbing the selective wavelength of the selective heating process and the first silicide material to remain below a second temperature based on the first silicide material absorption wavelength minimally absorbing the selective wavelength of the selective heating process.

2. The method of claim 1, wherein heating the second source/drain material further comprises irradiating the second source/drain material with the selective wavelength having a first peak wavelength at a first intensity via the selective heating process.

3. The method of claim 2, further comprising adjusting the selective wavelength having the first peak wavelength of the selective heating process while performing the selective heating process on the substrate, the first transistor device with the first silicide material, and the second transistor device.

4. The method of claim 3, further comprising determining a dopant concentration in the second source/drain material, wherein the selective wavelength having the first peak wavelength of the selective heating process is adjusted based on the dopant concentration in the second source/drain material.

5. The method of claim 2, further comprising executing a deposition process after the performing the selective heating process.

6. The method of claim 5, further comprising repeating the steps of the performing the selective heating process and the executing the deposition process.

7. The method of claim 6, wherein the second temperature is 500° C.

8. The method of claim 2, wherein the performing the selective heating process follows a heating sequence including set points of the selective wavelength having the first peak wavelength at corresponding set points of the first intensity over a corresponding first set of time intervals.

9. The method of claim 2, wherein the first silicide material absorption wavelength of the first silicide material does not include the selective wavelength having the first peak wavelength.

10. The method of claim 2, wherein the selective heating process includes using a tunable microwave anneal system configured to emit at the first peak wavelength and the first intensity.

11. The method of claim 10, wherein a range for the first peak wavelength of the tunable microwave anneal system emission is 42 to 150 millimeters.

12. The method of claim 2, wherein the selective heating process includes using a tunable laser anneal system configured to emit at the selective wavelength having the first peak wavelength and the first intensity.

13. The method of claim 12, wherein a range for the selective wavelength having the first peak wavelength of the tunable laser anneal system is 700 nm to 2,000 nm.

14. The method of claim 2, wherein the second source/drain material is silicon or silicon germanium.

* * * * *